US006926770B2

(12) United States Patent
Peng et al.

(10) Patent No.: US 6,926,770 B2
(45) Date of Patent: Aug. 9, 2005

(54) METHOD OF FABRICATING TWO-DIMENSIONAL FERROELECTRIC NONLINEAR CRYSTALS WITH PERIODICALLY INVERTED DOMAINS

(75) Inventors: Lung-Han Peng, Taipei (TW); Way-Seen Wang, Taipei (TW); Shu-Mei Tsan, Kaohsiung (TW); Yi-Chun Shih, Taipei (TW); Yung-Chang Zhang, Taipei (TW); Chao-Ching Hsu, Taoyuan (TW)

(73) Assignee: National Taiwan University, Taipei (TW)

( * ) Notice: Subject to any disclaimer, the term of this patent is extended or adjusted under 35 U.S.C. 154(b) by 82 days.

(21) Appl. No.: 10/434,233

(22) Filed: May 9, 2003

(65) Prior Publication Data
US 2004/0192040 A1 Sep. 30, 2004

(30) Foreign Application Priority Data

Mar. 27, 2003 (TW) ........................................ 92107008 A (51) Int. Cl.[7] ............................................... C30B 33/06
(52) U.S. Cl. ..................... 117/2; 117/1; 117/19; 117/20
(58) Field of Search ........................... 117/1, 2, 19, 20; 359/245

(56) References Cited

U.S. PATENT DOCUMENTS

3,384,433 A 5/1968 Bloembergen
5,193,023 A 3/1993 Yamada et al. ............. 359/245
5,526,173 A 6/1996 Yamaguchi et al. ........ 359/328
5,568,308 A 10/1996 Harada ....................... 359/326
5,800,767 A 9/1998 Byer et al. .................. 264/430
5,877,977 A 3/1999 Essaian ....................... 365/145
6,156,255 A 12/2000 Byer et al. .................. 264/406
6,195,196 B1 2/2001 Kimura et al. .............. 359/295
6,211,999 B1 4/2001 Gopalan ..................... 359/326
6,295,159 B1 9/2001 Lung-Han et al. .......... 359/326

*Primary Examiner*—Felisa Hiteshew
(74) *Attorney, Agent, or Firm*—Troxell Law Office, PLLC (57) ABSTRACT

The present invention relates to a method to control the nucleation and transverse motion of 180° inverted domains in ferroelectric nonlinear crystals. It includes a process composing of a high temperature oxidation of the first metal layer and a pulsed field poling of the second electrodes. The main object of present invention is to provide domain inversion of ferroelectric nonlinear crystals with field control the nucleation and transverse motion of inverted domains and two-dimension nonlinear photonic crystals for time-domain multiple-wave simultaneous lasers and space filter function. Another object of present invention is to provide space-charge effect for screened edge field beneath the metal electrode, The other object of present invention is to provide the constraint of inverted domain nucleation in the oxidized electrode for arbitrarily geometrical form of 2D ferroelectric lattice structure.

7 Claims, 13 Drawing Sheets

METHOD OF FABRICATING TWO-DIMENSIONAL FERROELECTRIC NONLINEAR CRYSTALS WITH PERIODICALLY INVERTED DOMAINS

FIELD OF THE INVENTION

The present invention relates to a Method of fabricating two-dimensional ferroelectric nonlinear crystals with periodically inverted domains, particularly to domain inversion of ferroelectric nonlinear crystals with pulse field poling the nucleation site and transverse motion of inverted domains and two-dimensional nonlinear photonic crystals for time-domain multiple-wave simultaneous lasers and space filter. Therefore, this invention can be employed space-charge effect for screened fringing field beneath the metal electrode and constraint of inverted domain nucleation site in the oxidized electrode for arbitrarily geometrical form of two-dimension ferroelectric lattice structure.

BACKGROUND OF THE INVENTION

The physical feature for ferroelectric crystal is the spontaneous polarization ($P_s$), and the ferroelectric domain to reverse its spontaneous polarization ($P_s$). It offers an alternative 180° inversion, i.e., so-called domain inversion, and the capability to apply an electric field across the polar axis to overcome the coercive field ($E_c$)in ferroelectric. One such example takes advantage of the reversible polarization and fast switching time to realize high-density memory devices for data storage, such as: S. Essaian "Nonvolatile memory based on metal-ferroelectric-metal-insulator semiconductor structure" U.S. Pat. No. 5,899,977 and O. Auciello et al. "The physics of ferroelectric memories", Physics Today, pp. 22–27, July, 1998.

Figure 1:
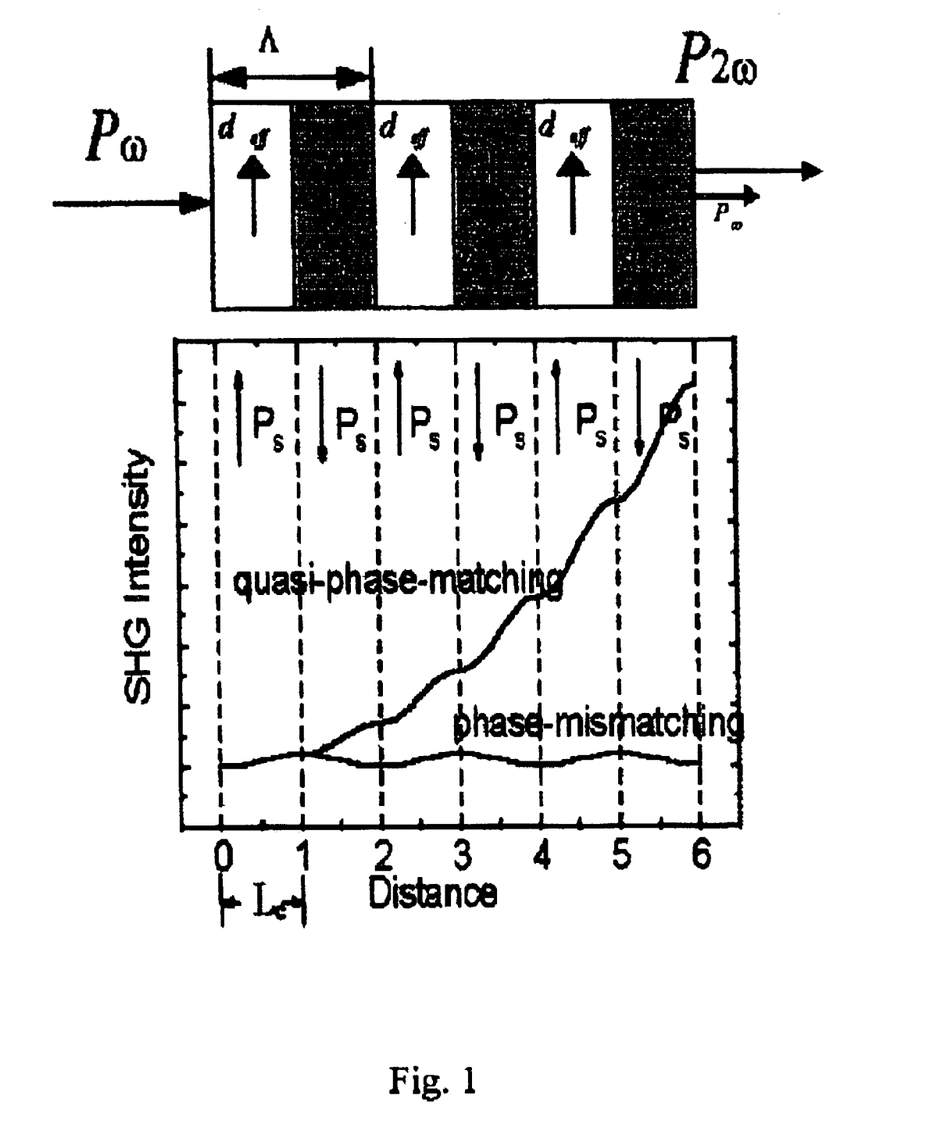
FIG. 1 is a diagram showing quasi-phase-matching (QPM) periodically inverted domain structure and nonlinear frequency transformation.

In ferroelectric nonlinear crystals, the 180° change in the spontaneous polarization ($P_s$) offer optics nonlinear coefficient of odd-order physical tensor by sign change. Based on the following of: N. Bloembergen, U.S. Pat. No. 3,384,433 and "Interactions between light waves in a nonlinear dielectric", Phys. Rev. vol. 127, pp. 1918–1939, 1962, offer a wave front vector $K=2\pi/\Lambda$ approach by compensating effect of dispersion for the coefficient of refraction to overcome a phase-matching problem ($kt_\omega - 2k_\omega \neq 0$) when frequency transformation and satisfy the use of a Quasi-Phase-Matching (QPM) technique as shown in FIG. 1 with the relatively physical structure to satisfy $kt_\omega - 2k_\omega \neq 0$ and length of per inverted domain with $\Lambda = 2l_c$ at $l_c = \lambda/4(n2_\omega - n_\omega)$.

As mentioned above, M. Yamada et al. U.S. Pat. No. 5,193,023, "Method of controlling the domain of a nonlinear ferroelectric optics substrate", and "The first-order quasi-phase-matched LiNbO$_3$ waveguide periodically poled by applying an external field for efficient blue second-harmonic generation," in Appl. Phys. Lett. Vol. 62, pp. 435–436, 1993, that discloses a short pulse voltage is applied QPM structure of periodically poled lithium niobate (PPLN) for second-harmonic-generation (SHG) green laser. Y. Kitaoka et al., "Miniaturized blue laser using second harmonic generation", in Jpn. J. Appl. Phys. Vol. 39, pp. 3416–3418, 2000, that discloses the tiny QPM-SHG blue-laser technique such as 5×12×1.5 mm$^3$. Using the 20 mW-infrared semiconductor laser as the pumping source, the power of blue laser transformation is 2 mW.

The summary of technique problems for applying to QPM inverted domain structure comprises the item of:

(1). the situation becomes complicated on fabricating of small periodical inverted-domain structure due to the existence domain merge in the polarization switching process.

(2). improved the separation of fundamental frequency and frequency transformation light such as the same polarization direction and parallel each other to propagate the light.

Figure 2:
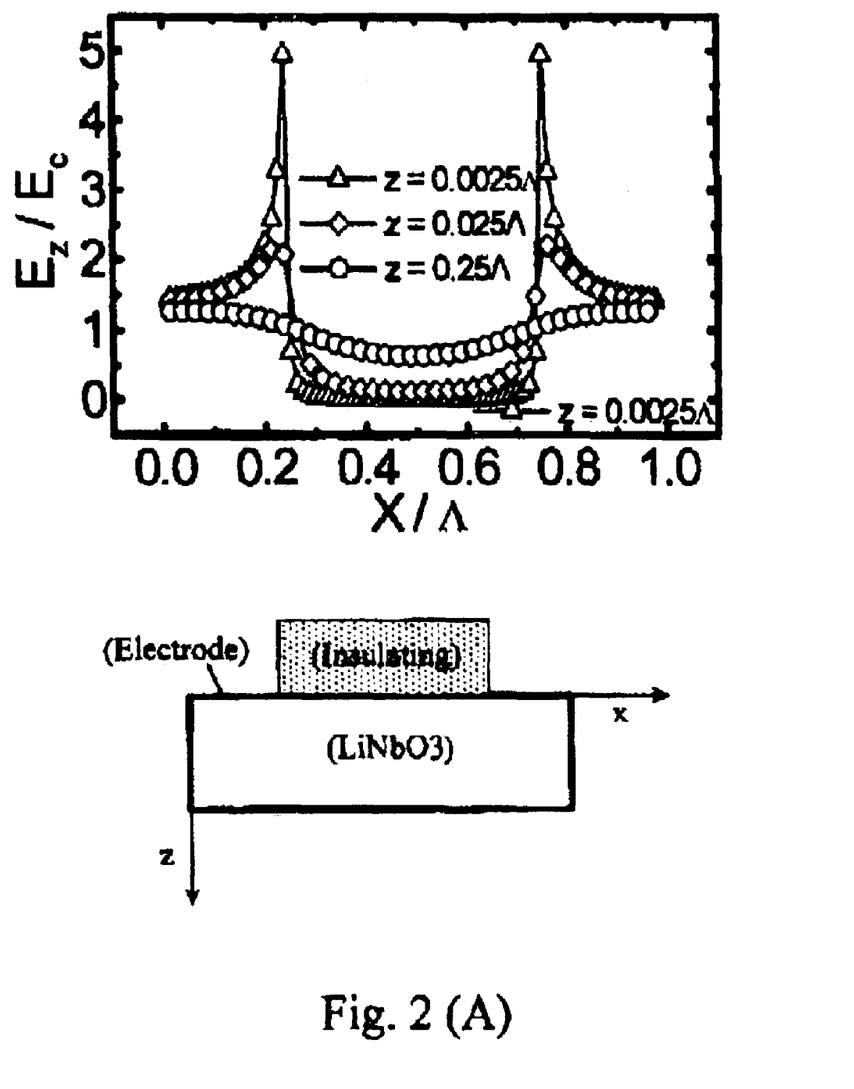

As discussed herein, the first problem reason belong to fringing field effect due to a large dielectric discontinuity underneath the electrode pattern. As shown in FIG. 2(A) of a conventional poling configuration of z-directional poling diverted voltage for normal field ($E_z$) enhanced current spreading in the unpatterned regime, which is normally coated with a layer of insulating material. The distribution of switching current and charged field play an important role in determining the arrangement of the reversed domains. Therefore, an external supply of the switching current, i.e., $2AdP_s/dt$ serves to compensate the depolarization field in the newly switching area A. According to analysis of static electricity as shown in FIG. 2(B) of a conventional poling configuration of z-directional poling diverted voltage, a relatively large non-isotropy $E_x \sim 4E_c$ can exist underneath the insulating layer. $E_x$ is its field line pointing to an inward direction from both sides underneath the insulating layer for unnecessary inverted domian. This phenomenon shows to result in field screening and compensating in the unpatterned regime to bring up the issue of domain broadinging, and deviates the QPM condition formed on its lattice structure for low efficiency of nonlinear optical transformation.

In addition, the reason of problem (2) is due to the QPM condition limit wave frequecy transformation to the wave collinear incidence for in FIG. 1. Because the wave front of the structure with periodical diverted domain parallel the said wave collinear incidence, the fundamental wave, wave of transformaton, and wave front of the structure with periodical diverted domain paralleling each other can not distingu distinguish one from the others. Therefore, the conventional QPM device must take another filter to divide into the fundamental wave and wave of transformaton that caused great inconvenience.

Other the conventional problems are proposed as follows:
(1). The insulating layer in FIG. 3, it is to restrain the domain necleation and motion in a subsequent field poling process for fringing field of ferroelectric nonlinear crystals covered by periodical metal eletrode for inverted domain.

First, the SiO$_2$ material is applied at the isolating layer as shown in K. Mizuuchi et al., "Generation of ultraviolet light by frequency doubling of a red laser diode in a first-order periodically poled bulk LiTaO$_3$", Appl. Phys. Let. Vol. 70, pp. 1201–1203, 1997.

Next, the Ta$_2$O$_5$, WO$_3$, H$_f$O$_3$ material is applied at the isulating layer as shown in M. C. Gupta et al., "Method of inverting ferroelectric domains by application of controlled electric field", U.S. Pat. No, 5,756,263.

Subsequently, the spin-on-glass material is applied at the insulating layer as shown in G. D. Miller et al., "42%-efficient single-pass cw second-harmonic generation in periodically poled LiNbO$_3$", Opt. Lett. Vol. 22, pp. 1834–1836. 1997.

As mentioned above, the Appl. Phys. Lett. Vol. 70, pp. 1201–1203, 1997 issue can be related to fringing field enchanced current spreading ($W_{min}$) in the unpatterned regime, which is normally coated with a layer of insulating material such as SiO$_2$, the experienced form between $W_{min}$ and substrate thickness (T) is $W_{min}=0.0027T-0.21$ ($\mu$m).

Then, the $W_{min}=0.0027T-0.21$ ($\mu$m) is subjected to through said substrate thickness (T) to decide to fabricate the accurate method of the least period. For example, the 500-$\mu$m-thick LiNbO$_3$ structure carry out together with the application of said substrate thickness (T) and the least error of the inverted domain erred from the path of metal eletrode pattern is 1.14 $\mu$m. In addition, the 850-nm-thick QPM-SHG structure can be fulfilled by periodical domain diversion at coherent length ($l_c$) $l_c$=1.9 $\mu$m, then the substrate require lapping and polishing to become thin for the allowable error of QPM period.

Matsushita Electric Industrial Co., Phys. Lett. Vol. 70, pp. 1201–1203 (1997)], that discloses the substrate such as LiTaO$_3$ require lapping and polishing to 150-$\mu$m thickness for fabricating the inverted domain with a 1.7 $\mu$m period in QPM structure.

Sony Corp., Yamaguchi et al., "Method of local domain control on nonlinear optical materials", U.S. Pat. No. 5,526,173, that discloses the substrate such as LiNbO$_3$ require lapping and polishing to 100-$\mu$m thickness.

On the other hand, the substrate such as LiTaO$_3$ and LiNbO$_3$ having hard coefficient above 5 scale can be dirctly stressed to the irregural diverted domain of end surface of ferroelectric nonlinear crystals using stress-induced piezoelectricity because of the substrate require lapping and polishing to become thin. As a result the pulsed field poling is inevitably controlled problem of periodcal inverted domain and yielding rate.

(2). The diffusion technique for controlling the inverted domain is to during the high-temperature treatment or chemical treatment using the lithium-ion difussion of the inner crystals because of local inverted domain. Generally, the conventional techniques are proposed as follow: (a) titanium (Ti) diffusion, (b) proton exchange, (c) high-temperature lithium-ion out-difussion, (d) the oxide covered and heat treatment, such the (a) and (d) take place shallow surface domain inversion in the uncovered eletrode pattern regime and (b) take place shallow surface domain inversion in the uncovered metal pattern regime. The diffusion technique can support the big-area inverted domain using shallow surface domain inversion because of the temperature vs. time being exponential saturation. As the result the difussion technique is inevitably induced non-perpendicular boundary of inverted domain and changeable strauture and physical property.

S. Miyazawa, "Ferroelectric domain inversion in Ti-diffused LiNbO$_3$ optical waveguide," J. Appl. Phys. Vol. 50, 4599–4603, 1979, that discloses the titanium (Ti)-diffusion technique.

M. L. Bortz et al., "Noncritical quasi-phase-matched second harmonic generation in an annealed proton-exchange LiNbO$_3$ waveguide", IEEE Quantum Electron. Vol. 30, pp. 2953–2960, 1994, and K. Nakamura et al., "Antipolarity domain nucleation and growth during heat treatment of proton-exchanged LiTaO$_3$", J. Appl. Phys. Vol. 73, p. 1390, 1993, that discloses the proton-exchange technique.

K. Nakamura et al., "Ferroelectric domain inversion caused in LiNbO$_3$ plates by heat treatment", Appl. Phys. Lett. Vol. 50, pp. 1413–1414, 1987, that discloses the high-temperature lithium-ion out-difussion technique.

M. Fujimura et al., "Ferroelectric domain inversion induced by SiO$_2$ cladding for LiNbO$_3$ waveguide", Elec. Lett. Vol. 27, pp. 1207–1209, 1991, that disclosed the oxide covered such as SiO$_2$ and heat treatment.

C.-S. Lau et al., "Fabrication of MgO induced lithium out-diffusion waveguides," IEEE Photon. Technol. Lett. Vol. 4, pp. 872–875, 1992, that disclosed the oxide covered such as MgO and heat treatment.

As diffusion technique problems are proposed as follows:
1. The difussion only with shallow surface domain inversion take place in a triangular pattern in the uncovered LiNbO$_3$ regime, and in a half-circle pattern in the uncovered LiTaO$_3$ regime, the inverted domain can not give the the idea perpendicular boundary that as shown in FIG. 1 and can give an unwanted influence to the nonlinear wave transformation.

K. Yamamoto et al., "Characteristics of periodically domain-inverted LiNbO$_3$ and LiTaO$_3$ waveguides for second harmonic generation", J. Appl. Phys. Vol. 70, pp. 1947–1951, 1991, that discloses the boundary of periodical inverted domain in contrast to transformation efficiency.

2. The proton exchange cause the lattice composition and structure to form Li$_x$H$_{1-x}$NbO$_3$ and decrease the coefficient of nonlinear optical transformation. The resultant substrate is subjected to heat treatment of annealing for decreasing effect of the mentioned above, but said coefficient of nonlinear optical transformation restores the limited degrees. Y. N. Korkishko et al., "The SHG-response of different phase in proton-exchanged lithium niobate waveguide", IEEE J. Selected Topics in Quantum Electron. Vol. 6, pp. 132–142,2000, that discloses the proton exchange of the mentioned above.

(3). the decreasing coercive field (E$_c$) of the lump lattice to restrain the fringing field underneath the eletrode pattern. It can not change the optical nonlinear characteristic and transformation efficiency of the lattice, because of said decreasing coercive field (E$_c$) of the lump lattice reduces the defective density of lattices.

The conventional methods are proposed as follows:
1. Stoichiometric nonlinear crystals offers composition of Li$_2$O/(Nb$_2$O$_5$+Li$_2$O) or Li$_2$O/(Ta$_2$O$_5$+Li$_2$O) for 0.49–0.5 approach by substantially decreasing the coercive field to 2 kV/mm that is one tenth of congruent-grown crystals. V. Gopalan et al., "Lithium niobate single crystal and photo-functional device," U.S. Pat. No. 6,195,196 and V. Gopalan et al., "Lithium tantalate single crystal and photo-functional device," U.S. Pat. No. 6,211,999, that discloses the said stoichiometric nonlinear crystals.

2. MgO or ZnO doping in congruent-grown crystals using the the material of atomic bond equivalent to LiNbO$_3$ or LiTaO$_3$ such as A. Harada, "Fabrication of ferroelectric domain reversal", U.S. Pat. No. 5,568,308, that discloses the MgO doping in congruent-grown crystals, and L,-H. Peng et al., "Method for bulk periodic poling of congruent grown ferroelectric nonlinear optical crystals by low electric field", U.S. Pat. No. 6,295,159, that discloses the ZnO doping in congruent-grown crystals.

When doping in congruent-grown lithium niobate (LiNbO$_3$) is Li$_2$O/(Nb$_2$O$_5$+Li$_2$O)=0.485 wherein the doping control into the consistency range of 3~9 mol % for reducing lattice defects, the coercive field can effectively reduce one tenth of congruent-grown crystals and carry out the resistant-light destructiveness and resistant-light deflection.

As mentioned above, when doping in congruent-grown crystals for decreasing the coercive field, it must control the doping accuricy to overcome the induced law lattice quality for over doping and without compensated lattice defects for under doping.

(4). The pulsewave controlling offers the adjustment the field wave and duty cycle between the positive and negative electrode to shift the inverted domain such as: K. Mizuuchi et al., "Method for manufacturing domain-inverted region, optical wavelength conversion device utilizing such domain-inverted region and method for fabricating such device", U.S. Pat. No. 5,652,674 and R. G. Batchko et al., "Back-switching poling in lithium niobate for high-fidelity domain patterning and efficient blue light generation", Applied Physics Letters, Vol. 75, pp. 1673–1775. Said the pulse-wave controlling must appropriate liquid eletrode in order to avoid the dielectric collapse of material. Such as: R. L. Byer et al., "Electrical field domain patterning," U.S. Pat. No. 5,800,767 and U.S. Pat. No. 6,156,255.

SUMMARY OF THE INVENTION

The main object of present invention is to provide domain inversion of ferroelectric nonlinear crystals with field control the nucleation and transverse motion of inverted domains and two-dimensional nonlinear photonic crystals for time-domain multiple wave simultaneous lasers and space filter function.

Another object of present invention is to provide space-charge effect for screened fringing field beneath the metal electrode.

The other object of present invention is to provide the constraint of inverted domain nucleation in the oxidized electrode for arbitrarily geometrical form of two-dimension ferroelectric lattice structure.

In order to achieve foregoing objects, the present invention relates to a method of fabricating two-dimensional ferroelectric nonlinear crystals with periodically inverted domains, comprising the step of:

a) Forming a first metal electrode on nonlinear crystal;
b) Heat treatment thereof obtained according to a) at lower than Curie temperature;
c) Taking place first shallow surface domain inversion in thereof obtained according to b);
d) Forming a second metal electrode on thereof obtained according to c);
e) Applying a voltage higher than coercive field to thereof obtained according to d); and
f) Taking place second deep surface domain inversion in thereof obtained according to e).

BRIEF DESCRIPTION OF THE DRAWINGS

The present invention will be better understood from the following detailed description of preferred embodiments of the invention, taken in conjunction with the accompanying flow diagram, in which

FIGS. 2(A) and (B) are diagrams showing normal field ($E_z$) and tangential field ($E_x$) distribution at various depths beneath the insulating layer according to conventional poling configuration;

FIG. 5(C) is a diagram showing temperature-tuning curves of SHG power and the fitting result for using a 1064 nm Nd:YAG laser as the pumping source according to the second embodiment of the present invention;

DETAILED DESCRIPTION OF THE PREFERRED EMBODIMENT

The following descriptions of the preferred embodiments are provided to understand the features and the structures of the present invention.

Figure 3:
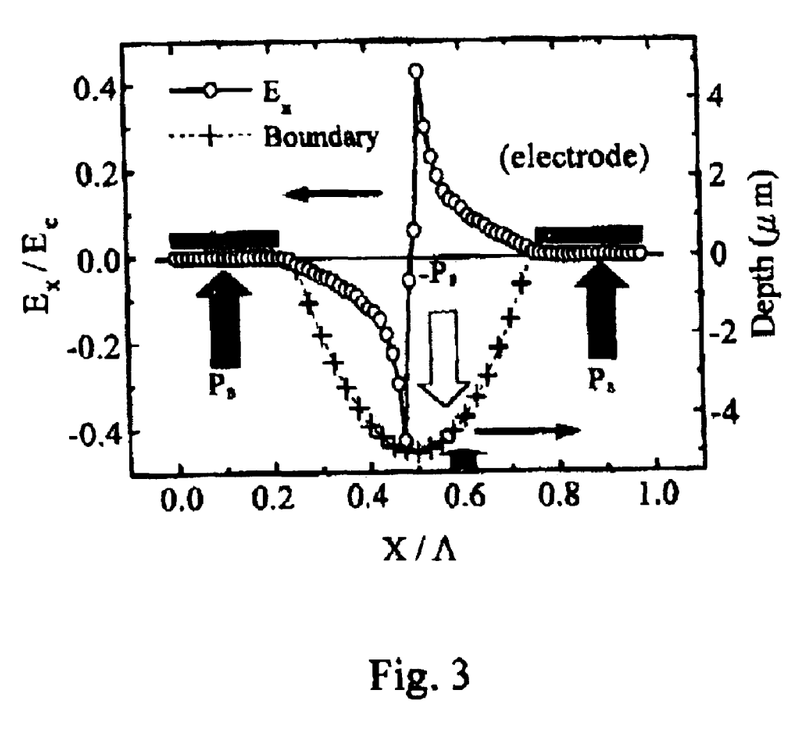
FIG. 3 is a diagram showing tangential field ($E_x$) underneath a positively charged parabola intervening between the electrodes according to the present invention.
Figure 4A:
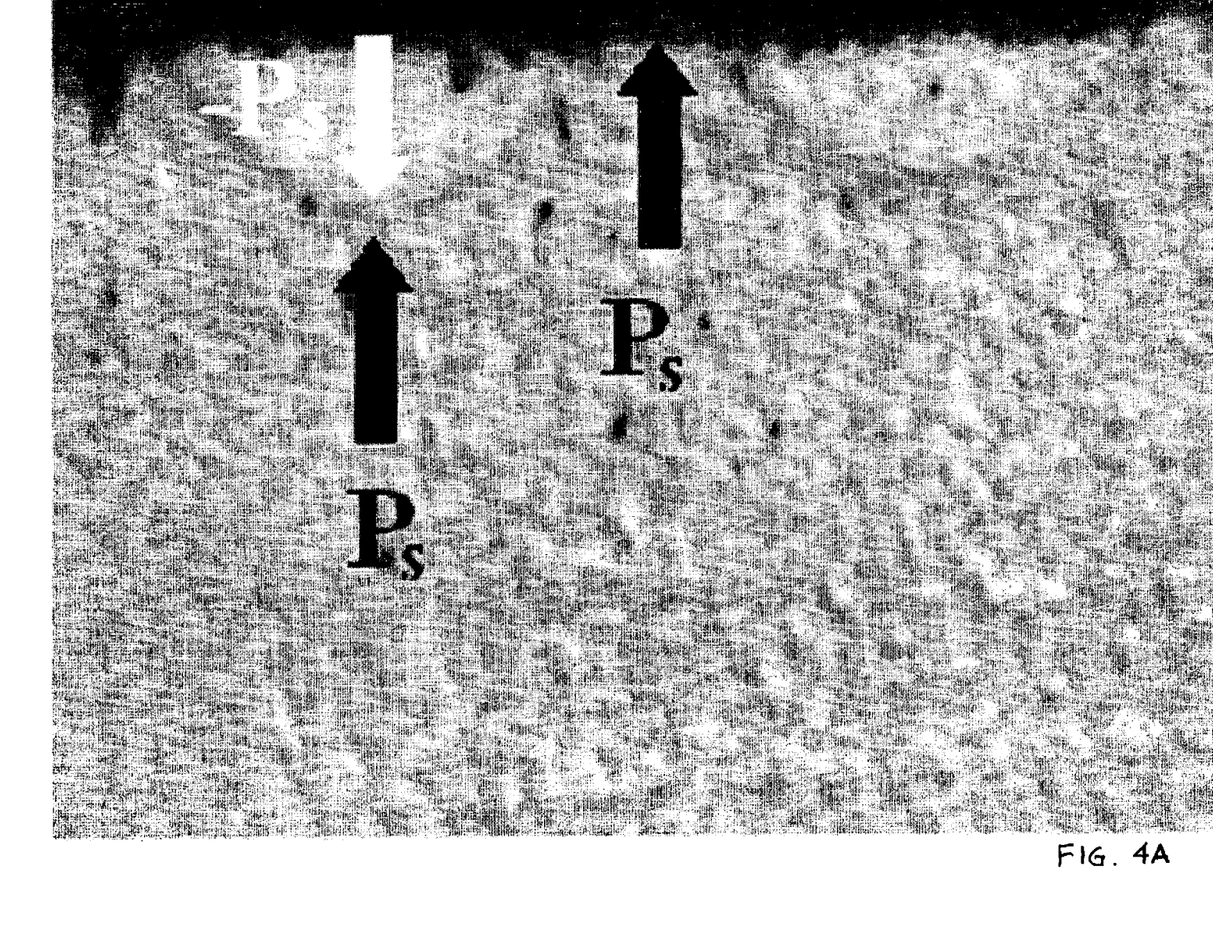
FIG. 4(A) is a diagram showing y face micrograph of a z-cut, 500-$\mu$m-thick PPLN-QPM structure with 20 $\mu$m period after the heat treatment at 1050° C. for 5 h according to the first embodiment of the present invention.
Figure 4B:
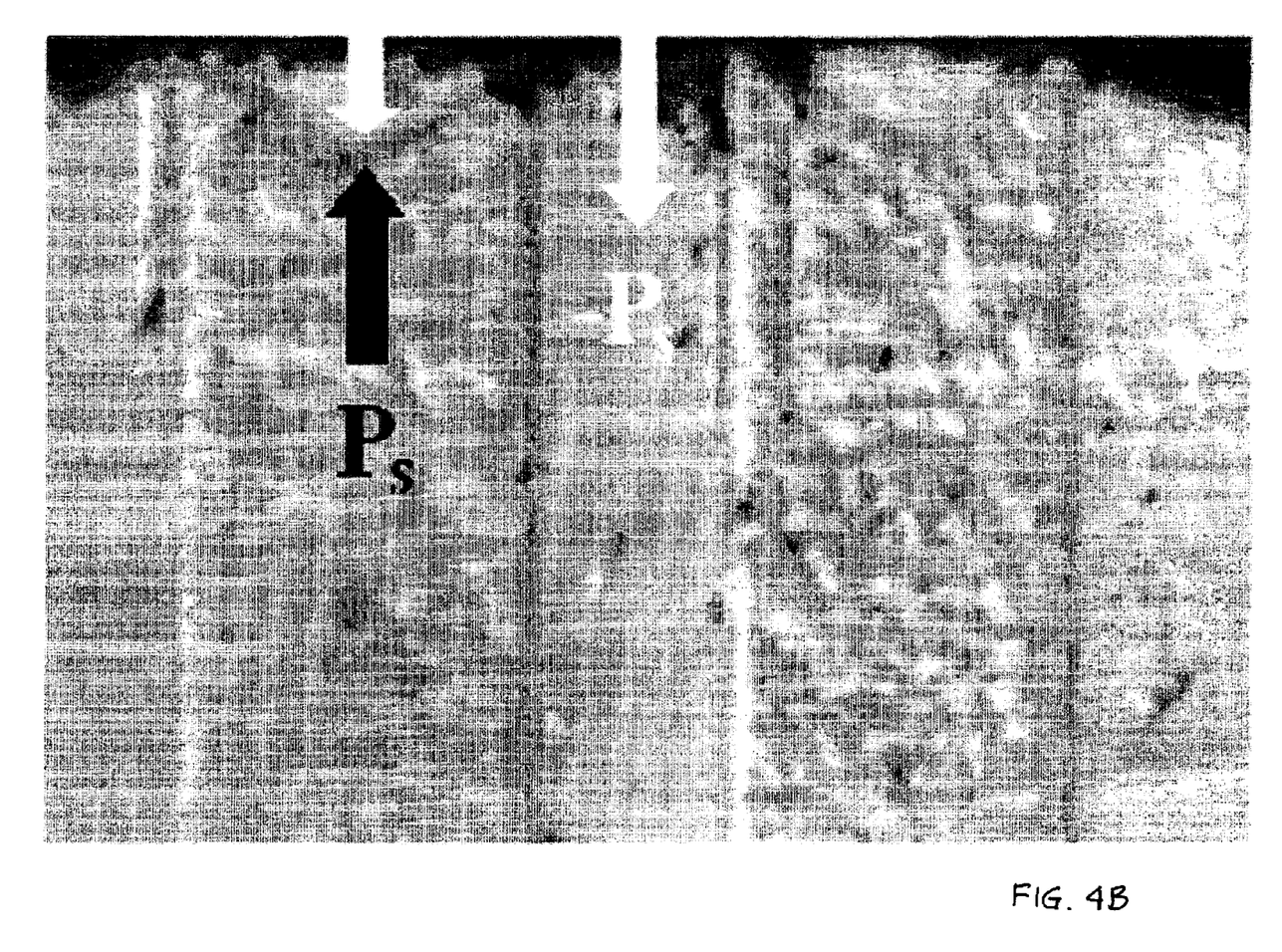
FIG. 4(B) is a diagram showing y face micrograph of a z-cut 500 $\mu$m-thickness PPLN-QPM structure with 20 $\mu$m period after the heat treatment at 1050° C. for 5 hour and followed up by a pulsed field poling according to the first embodiment of the present invention.

FIG. 3 illustrates a spatial distribution of $P_s$ in the subsurface regime to restrain the domain nucleation and motion in a subsequent field poling process. The shallow surface domain inversion takes place in a triangular spatial distribution, whose thickness can be as deep as 5 $\mu$m. FIG. 4(A) illustrates the y face micrograph of an etched 20-$\mu$m-period quasi-phase-matching (QPM) structure after the first high-temperature treatment at 1050° C. for 5 h. FIG. 4(B) illustrates the etched y face micrograph of a periodically poled LiNbO$_3$ QPM structure that has undergone both the heat treatment and pulsed field poling. In comparison, the inverted triangular domains formed during the first heat treatment remain unchanged and stay outside the electrode regime after the pulsed field poling. The present invention is to disclose method of fabricating two-dimensional ferroelectric nonlinear crystals with periodically inverted domains, comprising the step of:

a). Form a first metal electrode on nonlinear crystal. The said crystal is selected from the group consisting of congruent-grown lithium niobate LiNbO$_3$ (Li$_x$H$_{1-x}$NbO$_3$), congruent-grown lithium tantalate LiTaO$_3$ (Li$_x$H$_{1-x}$TaO$_3$), zinc oxide doped congruent-grown lithium niobate (ZnO:LiNbO$_3$), magnesium oxide doped congruent-grown lithium niobate (MgO:LiNbO$_3$), stoichiometric LiNbO$_3$, magnesium oxide doped stoichiometric LiNbO$_3$, stoichiometric LiTaO$_3$, and magnesium oxide doped stoichiometric LiTaO$_3$. The said first metal electrode is selected from the group consisting of aluminum(Al), zinc(Zn), nickel(Ni), titanium(Ti), tantalum(Ta), gold (Au), chromium (Cr), silver(Ag), silicon (Si), germanium (Ge) or alloys thereof. The said first metal electrode is a one-dimension or two-dimension figure.

b). Heat treatment thereof obtain according to a) at lower than Curie temperature. The said heat treatment is in ambient oxygen.

c). Take place first shallow surface domain inversion in thereof obtained according to b). The said heat treatment at lower than Curie temperaturel is to take place first shallow surface domain inversion in said thereof obtained according to b) excluding said first metal electrode covered. The diffusion of said first shallow surface domain inversion is selected from the group consisting of Li out-diffusion by heat treatment, Ti-ion in-diffusion by heat treatment or proton exchange. The depth of said first shallow surface domain inversion is larger than 50 nm.

d) Form a second metal electrode on thereof obtained according to c) said second metal electrode is selected from the group consisting of aluminum(Al), zinc(Zn), nickel(Ni), titanium(Ti), tantalum(Ta), gold(Au), chromium (Cr), silver(Ag), silicon (Si), germanium(Ge) or alloys thereof. The pulsed field poling of said second deep surface domain inversion is applied voltage domain inversion with higher than coercive field of said crystal.

e) Apply a voltage higher than coercive field to thereof obtain according to d). And f) Take place second deep surface domain inversion in thereof obtained according to e).

The first embodiment of present invention for process of fabricating one-dimensional ferroelectric nonlinear crystals with periodically inverted domains is proposed as follows:

In the first step, polarization switching was performed on 500-μm-thick, Z-cut congruent grown LiNbO$_3$ substrates purchased from Crystal Technology, USA. A thin (~50 nm) aluminium (Al) electrode pattern (said first metal electrode) was evaporated onto the +Z face of LiNbO$_3$ using a standard lithography technique. In the next step, a typical procedure is to let the patterned sample be placed inside a quartz tube furnace and undergo heat treatment at 1050° C. for 5 h in an air ambience, and then take place said first shallow surface domain inversion. The electrode pattern of said first metal electrode is selected from the group consisting of evaporation or electron beam sputtering. As shown in FIG. 4(A) is the y-cut micrograph of an etched 20-μm-period PPLN-QPM structure with HF etching solution after the said heat treatment. Said first shallow surface domain inversion takes place in a triangular spatial distribution, whose thickness can be as deep as 5 μm. Said the first metal electrode can preserve the underlying LiNbO$_3$ domain in its original polarization state.

After the said heat treatment and then pulsed field poling, the first oxidized electrode was applied to a pulsed voltage at 12 KV and 20 ms for domain inversion as shown in FIG. 4(B) to the y-cut micrograph of PPLN-QPM structure. The new 180° periodically inverted domains is found to take place only underneath the oxidized electrode. That is, it Is the use of micro-porosity from the oxidized electrode to establish an electric contact and form nucleation sites of domain inversion. Furthermore, the second periodically inverted domains formed during pulsed voltage remain tangential to move and confined to the edge of triangular domain boundary formed during the said heat treatment. The thickness of said second periodically inverted is 500 μm to penetrate LiNbO$_3$ substrate. The FIG. 4(B) clarifies the use of positively charged barriers to inhibit the fringing field of tangential direction and to constrain the growth of domain inversion.

Figure 5:
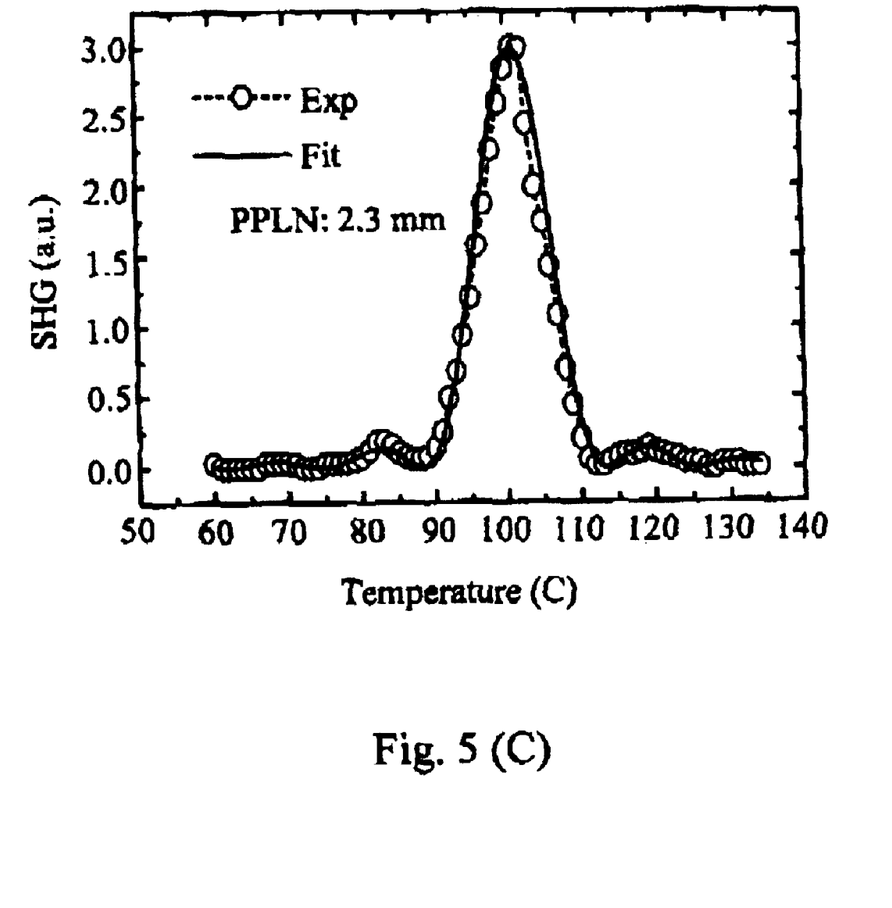
Figure 5A:
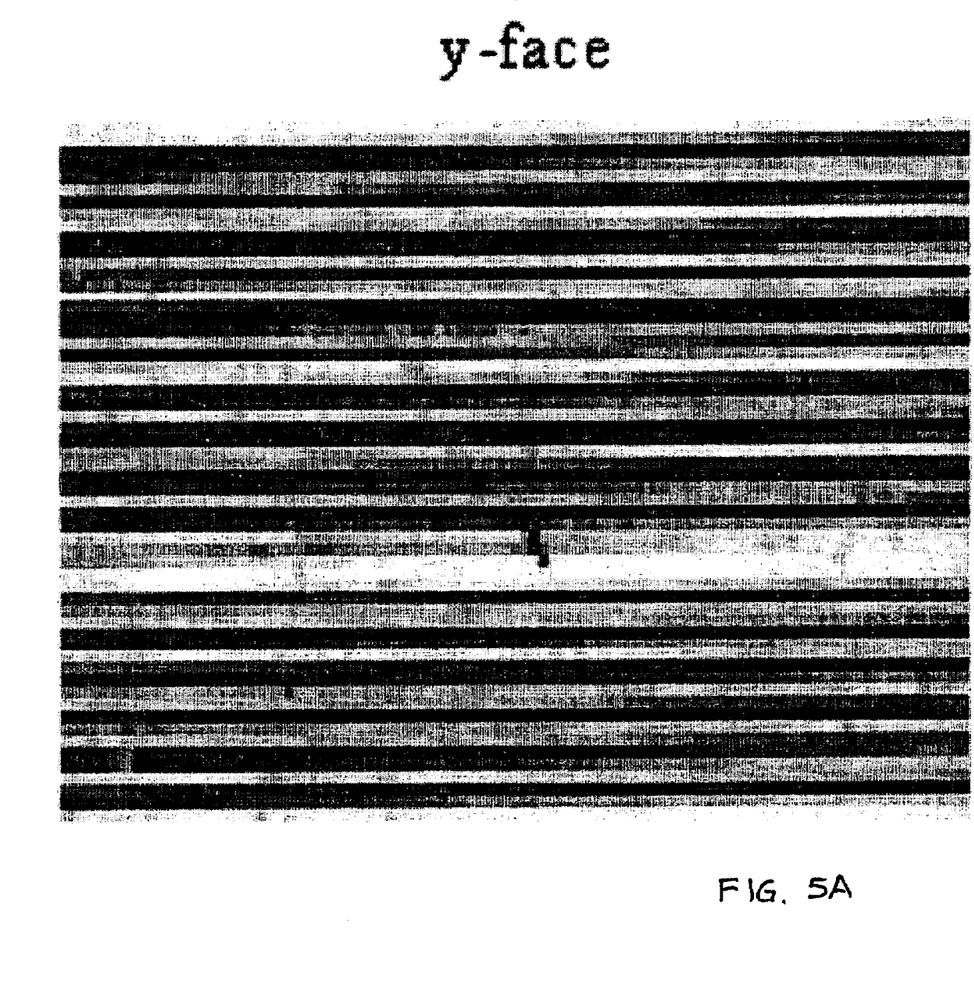
FIGS. 5(A) and (B) are diagrams showing y face and -z cut micrograph of a z-face 500 $\mu$m-thick PPLN-QPM structure with 6.8 $\mu$m period according to the second embodiment of the present invention.
Figure 5B:
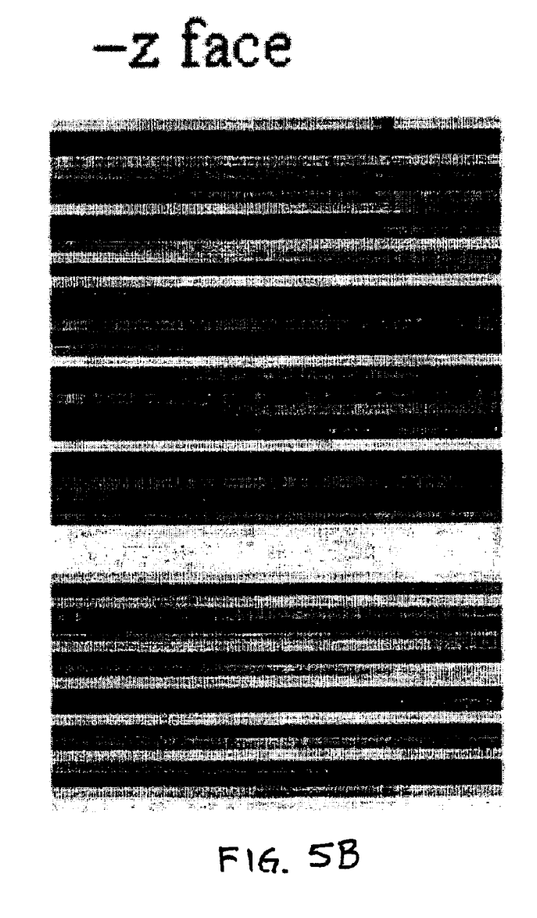

The second embodiment of present invention for process of fabricating one-dimensional ferroelectric nonlinear crystals with periodically inverted domains to small nominal period (less than 8 μm) is proposed as follows:

To fabricat the QPM-SHG inverted domains to small nominal period (less than 8 μm) on congruent-grown lithium niobate LiNbO$_3$, the first metal electrode oxidizes during heat treatment at 1050° C. for 5 h in an air ambience, and then apply to a pulsed voltage at 12 KV and 10 ms for domain inversion. FIG. 5 show the etched micrograph of the (A) y, and (B) -Z faces of a QPM-SHG structure with a nominal 6.8 μm period on 500-μm-thick congruent-grown lithium niobate LiNbO$_3$ with HF etching solution. Because of switching 180° periodically inverted domains have the different etching rates for HF etching solution, the FIG. 5(A) and FIG. 5(B) alternate with black and white stripe. FIG. 5(C) shows the operational temperature for the second-harmonic-generation (SHG) green light to use a 1064 nm YAG laser. The peak value of the frequency transformation meets at 100° C. to proof the OPM-SHG physical mechanism and half-height width of spectral regime reaches a efficacious lattice structural length of 2.3 mm. The framework of experiment in FIG. 1, the x-directional of QPM-SHG structure transfer the fundamental frequency and SHG green light, furthermore, it need the filter to split the SHG green light.

Figure 6:
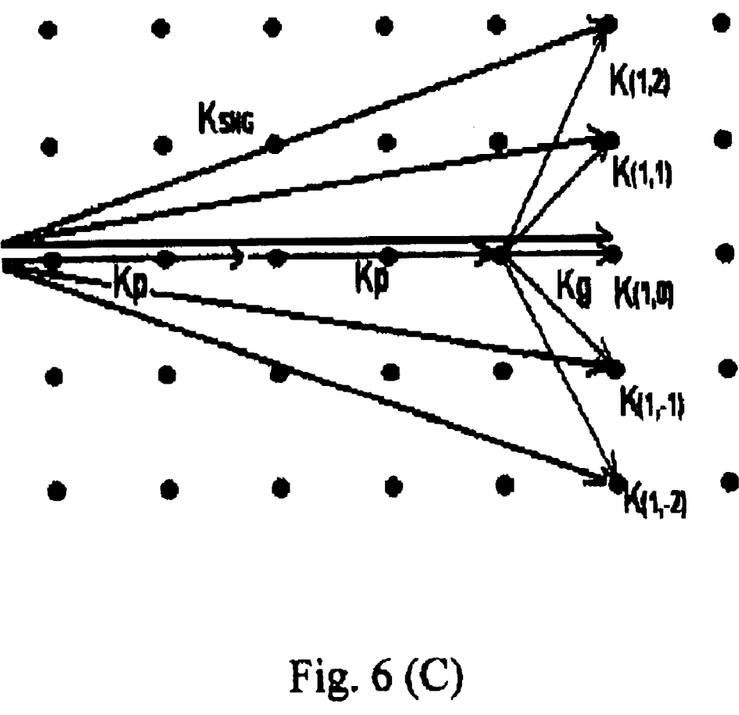
FIG. 6(A) is a diagram showing 2D PPLN-QPM rectangle lattice structure according to the third embodiment of the present invention.
FIG. 6(B) is a diagram showing CCD image and intensity of far field pattern from the emission of arrayed 2D QPM-SHG pumped by a 1064 nm Nd:YAG laser of FIG. 6 (A)
FIG. 6(C) is a diagram showing the different angles between fundamental frequency light and multiple lattice vectors of 2D PPLN-OPM rectangle lattice structure from the emission of arrayed 2D QPM-SHG pumped by a 1064 nm Nd:YAG laser according to the third embodiment of the present invention.
FIG. 6(D) is a diagram showing the different direction between fundamental frequency photon and the emission of arrayed 2D QPM-SHG pumped by a 1064 nm Nd:YAG laser of 2D PPLN-QPM rectangle lattice structure for lattice component $K_{1,\pm 1}$ with fine tuning ±1.5° the incident angle of fundamental frequency photon according to the third embodiment of the present invention.
Figure 6A:
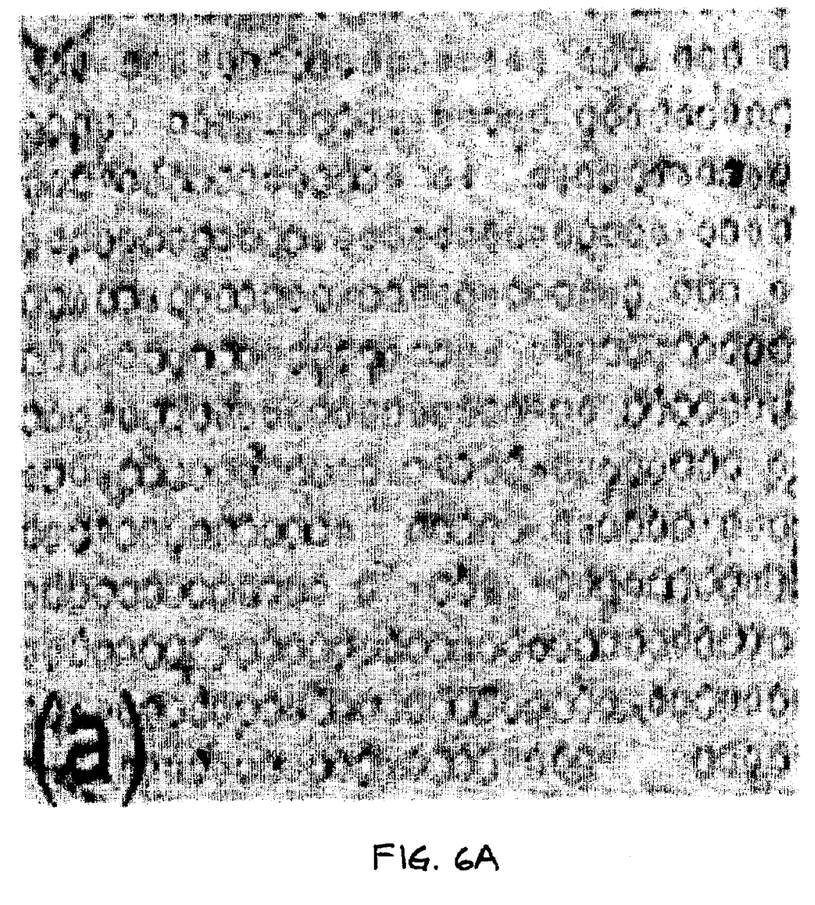
Figure 6B:
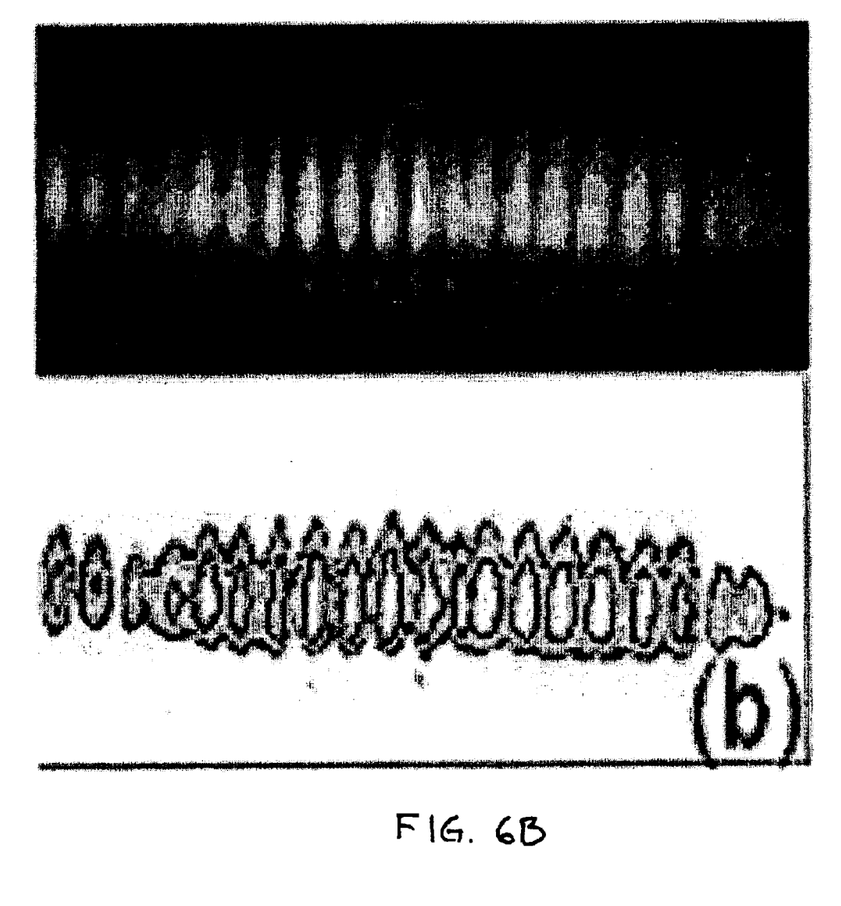

FIG. 6(A) shows 2D PPLN-QPM rectangle lattice structure. FIG. 6(B) shows CCD image and intensity of near field pattern from the emission of arrayed 2D QPM-SHG pumped by a 1064 nm Nd:YAG laser of FIG. 6(A). FIG. 6(C) shows the different angles between fundamental frequency light and multiple lattice vectors of 2D PPLN-QPM rectangle lattice structure from the emission of arrayed 2D QPM-SHG pumped by a 1064 nm Nd:YAG laser according to the third embodiment of the present invention. FIG. 6(D) is a diagram showing the different direction between fundamental frequency photon and the emission of arrayed 2D QPM-SHG pumped by a 1064 nm Nd:YAG laser of 2D PPLN-QPM rectangle lattice structure for lattice component $K_{1,\pm 1}$ with fine tuning ±1.5° the incident angle of fundamental frequency photon.

The third embodiment of present invention for process of fabricating two-dimensional ferroelectric nonlinear crystals with periodically inverted domains is proposed as follows:

To fabricat the two-dimensional ferroelectric nonlinear crystals with periodically inverted domains on 500-μm-thick congruent-grown lithium niobate LiNbO$_3$ substrates, the first metal electrode oxidizes and transforms into a pattern during heat treatment at 1050° C. for 5 h in an air ambience. The said first metal electrode is a one-dimentional electrode pattern or two-dimensional pattern. In the uncovered LiNbO$_3$ regime takes palce said shallow surface domain, another It can preserve the inderlying LiNbO$_3$ domain in positively charged domain boundary. The next apply a pulsed voltage at 12 KV to said second metal eletrode for domain inversion. If the first metal eletrode is a one-dimentional pattern, the second metal eletrode places on the first oxidized eletrode to form the two-dimentional pattern. It is the use of micro-porosity from the oxidized electrode to establish an electric contact and form nucleation sites of domain inversion for LiNbO$_3$ regime. If the first metal eletrode is a two-dimentional pattern, it can apply the electrolyte to use of micro-porosity from the oxidized electrode to establish an electric contact and form nucleation sites of domain inversion for LiNbO$_3$ regime. FIG. 6(A) shows 2D PPLN-QPM rectangle lattice structure with periodicity of 6.8×13.2 μm$^2$.

The 2D QPM-SHG structure apply to use a 1084 nm YAG laser as second-harmonic-generation transformation approach to show 2D lattice structure with cylinder-like domain pattern whose periodically is 6.8×13.2 μm$^2$ in FIG. 6(A). In the above embodement, the y-directional of 2D-QPM structure with 13.2 μm period supports the deflection of the x-directional of 2D-QPM structure with 6.8 μm period by wave front vector to generate YAG light. Such a function is to space wave filter for fundamental frequency light. Because of the second embodiment is x-directional of 1D-QPM structure with small period to generate QPM-SHG light for parallel, it need the filter to split.

FIG. 6(B) shows CCD image and Intensity of near field pattern from the emission of arrayed 2D QPM-SHG green laser with periodicity of 6.8×13.2 $\mu m^2$. The theory analysis of space refraction effect response to the different lattice vector $K_{mn}$ for arrayed green laser as show in FIG. 6(C). it is can use y-directional nonlinear raster by deflection lattice vector $K_{mn}$ to match angle and intensity of SHG green laser. Because of y-directional level symmetry of the 2D structure, it has special corresponding angle in pairs between the lattice vector $K_{mn}$ to match SHG green laser and y axis. The 1D QPM structure with periodicity of 6.8 $\mu m$ in FIG. 6(B), the emission of $K_{1,0}$ SHG green laser with corresponding angle of 0° to Y axis overlap the fundamental frequency YAG laser by parallel. FIG. 6(D) show operational temperature curve of the arrayed green laser. Applying the phase-matching high-order harmonic generation green laser to the y-directional raster can change the operational temperature from 8° C. to 80° C. that compare to the same-long 2D QPM structure in FIG. 6.

To sum up the above mentioned, the present invention is inventive, innovative and progressive. The patent for this present invention is hereby applied for. It should include all variations and versions covered by the present invention, including possible minor improvements and more exact definitions.

The above mentioned practical examples are used to describe the invention in more detail, they should therefore be included in the range of the invention, but should not restrict the invention in any way.

What is claimed is:

1. A method of fabricating two-dimensional ferroelectric nonlinear crystals with periodically inverted domains, comprising the steps of:

a) forming a first metal electrode on a nonlinear crystal, wherein said first metal electrode is in a one-dimensional or two-dimensional pattern;

b) heat treating the first metal electrode and nonlinear crystal in ambient oxygen at lower than Curie temperature to cause a first shallow surface domain inversion selected from the group consisting of Li out-diffusion by heat treatment, Ti-ion in-diffusion by heat treatment or proton exchange;

c) forming a second metal electrode on a crystal from step b); and applying a voltage higher than a coercive field to cause a second deep surface domain inversion.

2. A method according to claim 1, wherein said crystal is selected from a group consisting of congruent-grown lithium niobate $LiNbO_3$ ($Li_xH_{1-x}NbO_3$), congruent-grown lithium tantalate $LiTaO_3$ ($Li_xH_{1-x}TaO_3$), zinc oxide doped congruent-grown lithium niobate (ZnO: $LiNgO_3$), magnesium oxide doped congruent-grown lithium niobate (MgO: $LiNbO_3$), stoichiometric $LiNbO_3$, magnesium oxide doped stoichiometric $LINbO_3$, stoichiometric $LiTaO_3$, and magnesium oxide doped stoichiometric $LiTaO_3$.

3. A method according to claim 1, wherein said first metal electrode is selected from the group consisting of aluminum (Al), zinc(Zn), nickel(Ni), titanium(Ti), tantalum(Ta), gold (Au), chromium(Cr), silver(Ag), silicon(Si), germanium (Ge) or alloys thereof.

4. A method according to claim 1, wherein said heat treatment at lower than Curie temperature takes place in the first shallow surface domain inversion in said article obtained according to b) excludes said first metal electrode covered.

5. A method according to claim 1, wherein the depth of said first shallow surface domain inversion is larger than 50 nm.

6. A method according to claim 1, wherein said second metal electrode is selected form the group consisting of aluminum(Al), zinc(Zn), nickel(Ni), titanium(Ti), tantalum (Ta), gold(Au), chromium(Cr), silver(Ag), silicon(Si), germanium(Ge) or alloys thereof.

7. A method according to claim 1, wherein pulsed field poling of said second deep surface domain inversion is applied voltage domain inversion with higher than coercive field of said crystal.

* * * * *